May 3, 1966 B. BIRKENES 3,249,875

RADIO RECEIVER

Filed March 29, 1961

INVENTOR
BERNHARD BIRKENES
BY Mueller & Aichele

ATTYS.

3,249,875

RADIO RECEIVER

Bernhard Birkenes, Chicago, Ill., assignor to Motorola, Inc., Chicago, Ill., a corporation of Illinois Filed Mar. 29, 1961, Ser. No. 99,273
3 Claims. (Cl. 325—453)

Figures 1, 2:
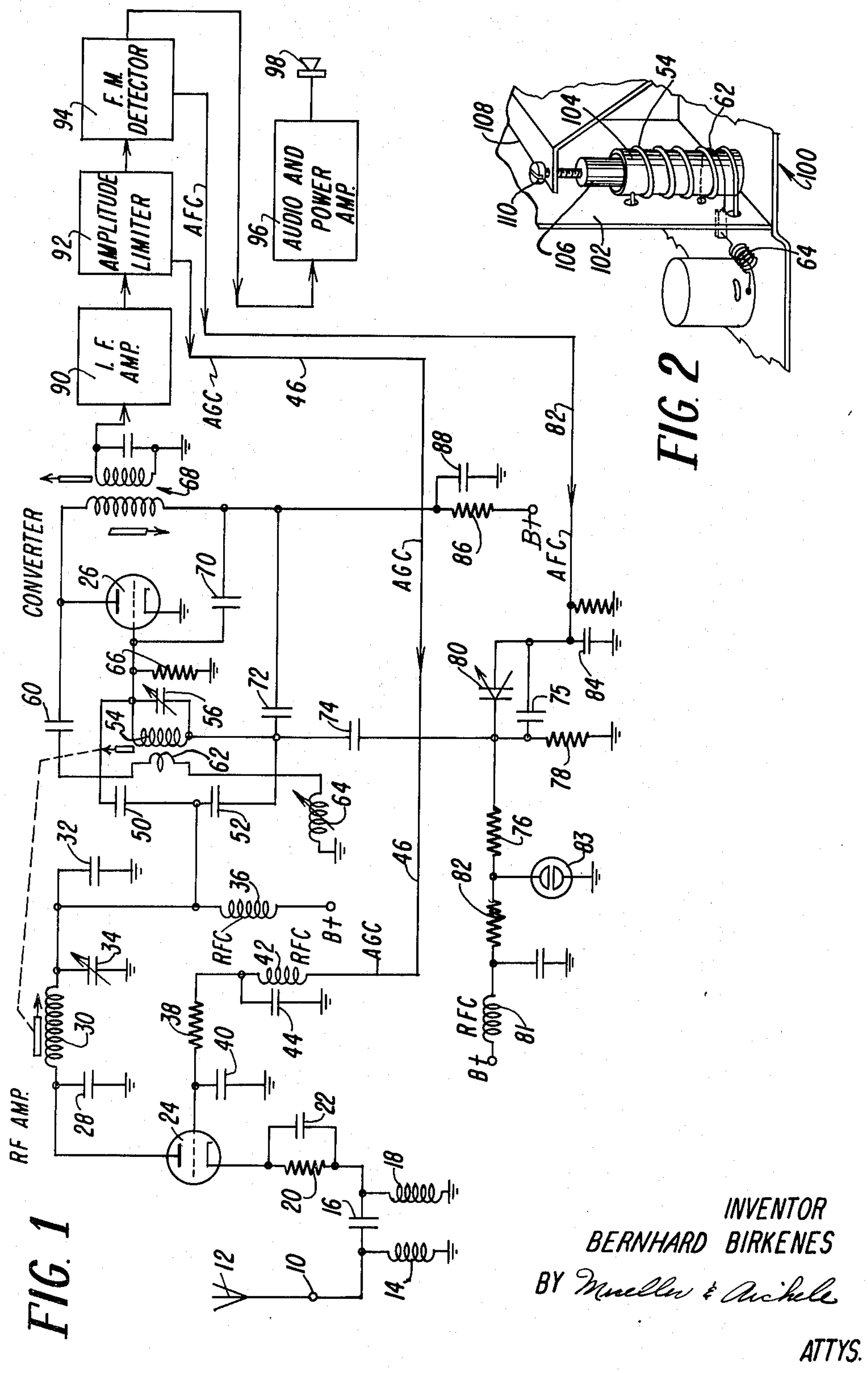

The present invention is directed to wave-signal receivers, and it is more particularly concerned with an improved tuning circuit and system for a wave-signal receiver of the superheterodyne type.

The tuning circuit and system with which the present invention is concerned includes the converter stage of the superheterodyne receiver, which stage is composed of, for example, a heterodyne oscillator and mixer circuit. The tuning circuit and system of the invention has particular application to frequency modulation superheterodyne receivers, and it will be described in such an environment. It will be appreciated, however, that the invention has general application wherever the problems now to be discussed are encountered.

A common problem in the provision of tuning systems of the type under consideration is that of providing an adjustable circuit which is capable of causing the heterodyne oscillator to be tuned through a particular frequency range, and at the same time to maintain a precise frequency spacing with the concurrent tuning of the radio frequency stage of the receiver. This precise frequency spacing is important so that a constant frequency intermediate frequency signal is produced by the tuning system throughout the tuning range. This intermediate frequency signal, as is well known, is then applied to the intermediate frequency amplifier stages of the receiver.

In a typical frequency modulation receiver, for example, it may be required that the heterodyne oscillator frequency be adjustable through a range of from 118.7 to 98.7 megacycles, as the radio frequency stage of the receiver is simultaneously tuned through a range of 108 to 88 megacycles; and that the heterodyne oscillator frequency be precisely maintained at a spacing of 10.7 megacycles on the high frequency side of the radio frequency signal throughout the tuning range.

Many difficulties have been encountered in the past in providing the proper tuning range for the heterodyne oscillator, so that the tuning system may function properly in the manner described above. The low frequency end of the tuning range has proven to be especially troublesome in the past. This is because tuning range can vary with variation in the wire thickness or coil form diameter of the inductance coil in the frequency determining network of the oscillator. Variations in the permeability of the adjustable tuning core of this inductance coil can cause troublesome variations in the tuning range of the oscillator.

The factors described in the preceding paragraph have rendered the design and practical quantity construction of wave-signal receivers extremely difficult, when it is desired that such receivers may exhibit optimum tuning characteristics throughout the entire tuning range. These factors have also caused the alignment and final adjustment at the factory of the tuning systems of the receivers to be especially difficult and troublesome.

It is, accordingly, an object of the present invention to provide an improved tuning system for use in a superheterodyne wave-signal receiver in which the tuning range of the heterodyne oscillator may be easily adjusted and set to a desired value for optimum operating efficiency of the system.

Another object of the invention is to provide such an improved tuning system which is extremely simple in its concept and which is capable of exhibiting the above described features and characteristics by the inclusion of a minimum of additional circuitry and components.

Yet another object of the invention is to provide such an improved tuning system which is conceived and constructed so that the required frequency range of the heterodyne oscillator can be obtained by an extremely simple and expedient adjustment.

Another object of the invention is to provide such an improved tuning system in which the heterodyne oscillator signal is maintained substantially uniform over the entire tuning range.

A feature of the invention is the provision of an auxiliary inductance coil in series with the inductance coil of the frequency determining network of the heterodyne oscillator; the coil being inductively uncoupled from any other coil, and the coil serves in a manner to be described to provide a simple and convenient means for adjusting the tuning range of the heterodyne oscillator without affecting other circuit parameters.

The above and other objects of the invention which are believed to be new are set forth in the claims. The invention itself, however, may best be understood by reference to the following description in conjunction with the accompanying drawing in which:

FIGURE 1 is a combined circuit diagram and block diagram of a radio receiver which is constructed to incorporate the improved tuning system of the present invention; and FIGURE 2 is a fragmentary representation of the manner in which certain of the circuit elements of the tuning system of FIGURE 1 may be mechanically mounted in the receiver.

The radio receiver of FIG. 1 is a frequency modulation superheterodyne type receiver. It is contemplated that the receiver may be of the type which can be used in an automobile and for this purpose it may be necessary to provide a power supply such as a transistor oscillator to develop the necessary high voltage to operate the vacuum tubes utilized in certain of the receiver stages. However, it is also possible to incorporate transistors in some stages of the receivers such as the audio amplifier section thereof. It is even possible to completely transistorize the receiver since the present invention is concerned with a tuning circuit for the receiver and it can find utility in a transistorized or vacuum tube type converter system.

The input terminal 10 of the receiver is connected to suitable antenna 12 and the terminal 10 is also connected to a pi network composed of shunt inductors 14 and 18 and the series capacitor 16. Input signals are applied through the bypass capacitor 22 to the cathode of the triode RF amplifier 24. The cathode bias for tube 24 is provided by the resistor 20. The pi network 14, 16 and 18 serves to match the impedance of the antenna to that of the cathode circuit of tube 24.

RF amplifier tube 24 is operated as a grounded grid amplifier and the output signals derived in the plate circuit thereof are tuned by means of the variable tuning inductor 30 which is series connected from the anode of tube 24 and through the choke 36 to the B+ potential for energizing tube 24. Fixed capacitor 28 is connected from the anode of tube 24 to ground and further fixed capacitor 32 is connected from the other side of tuning inductor 30 to ground. The variable trimmer 34 is shunted by capacitor 32 and the network 28, 30, 32 and 34 is designed to select signals in the frequency modulation band of 88–108 megacycles.

In the grid circuit of RF amplifier tube 24, the capacitor 40 is a bypass to ground and the resistor 38 and choke 42 are series connected between the grid and the AGC lead 46. An AGC potential may be developed in limiter circuit 92. A grounded bypass capacitor is connected to the junction of resistor 38 and choke 42.

The output signal from the RF amplifier is derived across the capacitors 32 and 34, that is, at the junction of tuning inductor 30 and the choke 36, and such signals are applied to the junction of capacitors 50 and 52. These capacitors are connected in series and the combination is connected in parallel with the oscillator tank inductor 54.

The converter stage operates on the autodyne principle. The oscillator tank circuit, including the inductor 54, the shunt capacitor 56 and the series connected capacitors 50 and 52, is balanced to ground by the grid capacity of tube 26 and the capacitor 70 on one side of the tank circuit, and the capacitor 72 and various elements of the AFC circuit on the other side of the tank circuit. The tuned input signal is fed at the junction of capacitors 50 and 52. Since the RF input point at the junction of capacitors 50 and 52 is balanced to ground, that is at zero potential as far as the oscillator voltage is concerned, oscillator signal radiation back to the antenna through the RF amplifier stage is minimized.

A resistor 66 is connected from the grid of tube 26 to ground to provide a direct current return for this electrode and the cathode of tube 26 is connected directly to ground. The variable slug of the oscillator tuning inductor 54 is ganged with the variable slug of the tuning inductor 30. Feedback for oscillations is obtained by the connection of a capacitor 60 between the anode of tube 26 and one side of the feedback inductor 62 which is inductively coupled to the tank inductor 54. The other terminal of inductor 62 is connected through the variable inductor 64 to ground. It will be recognized that the tuning slug which adjusts the tuning of the inductor 54 will establish the frequency of the local oscillator signals for the converter stage, which are normally at a frequency of 10.7 megacycles higher than the frequency of the desired signal to which the receiver is tuned.

The converted signal is derived from the anode of the tube 26 by means of a tuned IF transformer 68. The primary winding of transformer 68 is connected to the anode of tube 26 and through a decoupling resistor 86 to the B+ energizing potential. Capacitor 70 is connected between the junction of the primary winding of transformer 68 and resistor 86 and the grid electrode of tube 26 in order to introduce additional feedback for the oscillator portion of the converter circuit. A capacitor 72 also connected from the bottom side of the primary winding of transformer 68 to the lower terminal of the inductor 54 to furnish further regenerative feedback in the system. A capacitor 88 is connected from the lower terminal of the primray winding of transformer 68 to ground. The primary winding of transformer 68 is tuned and the effective net capacity of the capacitors 60, 72 and 88 all contribute to the tuning of the primary winding of the IF transformer 68.

The receiver also includes a network for automatic frequency control in order to maintain proper tuning adjustment of the converter circuit for a desired signal despite a tendency for drift in the converter circuit due to temperature changes or the like. To accomplish this AFC control the junction of the capacitor 52 and the inductor 54 is connected to ground through a series combination of capacitor 74, capacitor 75 and the bypass capacitor 84. The capacitor 75 is shunted by a voltage sensitive capacitor 80 the value of which changes with the level of a direct current potential applied thereto. The element 80 may be a reverse biased silicon diode. A direct current reference potential is established at the inter connection of capacitors 74 and 80 by means of a voltage regulator network. This network includes a series connected combination of RF choke 81, resistor 82, resistor 76 and resistor 78 series connected between B+ and ground. A neon regulator tube 83 is connected from the junction of resistors 82 and 76 to ground. A regulated potential is thus produced across resistors 76 and 78 and the junction of these two resistors is connected to voltage dependent capacitor 80. The other terminal of the voltage dependent capacitor 80 is connected to the AFC lead 82 which is direct current connected to the audio point of the ratio detector 94.

In the operation of the AFC system, if the tuning of the desired signal is not centered in the response curve of the ratio detector, a direct current voltage is produced on lead 82 which is applied to the voltage dependent capacitor 80 to cause a change in the effective total capacitance of capacitors 74, 75 and 80, thus changing the tuning of the oscillator tank circuit and tending to re-establish proper tuning of the desired signal within the detector response.

Considering now the output signals from the converter stage, such signals converted to the intermediate frequency of 10.7 megacycles are derived in the tuned secondary winding of transformer 68 and applied to the intermediate frequency amplifier 90. Signals from amplifier 90 are applied to an amplitude limiter circuit and from there to the ratio FM detector 94. The demodulated audio signals are then coupled to the audio amplifier 96 and from there to a loudspeaker 98 for reproduction. It will be apparent that the stages 90, 92, 94 and 96 may be of known construction, and that they may operate in a manner understood in the art so that further explanation is not believed necessary.

Considering now the alignment of the tuned circuits of the radio frequency amplifier stage and the converter stage of the receiver, proper tracking of the tuned circuits for the RF amplifier is obtained at the high frequency end of the FM band by adjustment of capacitor 34. Tracking of the low frequency end of the FM band may be obtained by mechanical adjustment of the tuning core for the inductor 30 with respect to the variable mounting thereof. In the oscillator tuning circuit, the trimmer capacitor 56 is used to set the oscillator on calibration at the high frequency end of the band. The tuning slug for inductor 54 is mechanically adjustable within its drive mechanism to permit calibration at the low frequency end of the receiver tuning end.

Variable inductor 64, which is connected to, but not inductively coupled to, the oscillator tuning circuit, is adjustable to provide an effective variation of the inductance of the inductor 54. This adjustment is made by physically moving the turns of inductor 54 closer together or farther apart. In this manner the system permits a control of the frequency range of the oscillator signals which is very desirable in production-type frequency modulation receivers. Adjustment of coil 64 is a simple and expedient means for overcoming tolerance variations in the wire size and coil diameter of inductor 54, as well as the variations in slug permeability among different production units of the tuning provision for inductor 54. Accordingly, the oscillator frequency can be tracked at opposite ends of the band by mean of mechanical adjustment of the slug for inductor 54 and adjustment of the trimmer capacitor 56, and additionally the oscillator tuning range can be accurately established by adjustment of inductor 64 despite slight variation of circuit parameters in the relatively critical tuning circuits of the local oscillator in the converter stage of the receiver.

It should also be pointed out that the additional impedance offered by the inductor 64 in the feedback circuit, that is from the bottom terminal of inductor 62 to ground, will tend to compensate for the normal reduction of the feedback signal at the high frequency end of the range, thereby helping to maintain sufficient oscillator feedback and a more uniform feedback level throughout the tuning range of the received. While it might seem that this same increase of oscillator feedback could be accomplished by utilizing more turns on the inductor 62, this would also increase the capacity between inductor 62 and the inductor 54 thereby increasing the capacitance between inductor 54 and ground. This, in turn, would adversely affect the frequency range of the local oscillator so that the proper oscillator tuning range would not be obtained. However, the increase of feedback is especially helpful at the high frequency end of the tuning range and is provided in the system by utilizing inductor 64 without the concurrent adverse effect on the tuning range of the local oscillator circuit.

The physical arrangement of the portion of the circuit for the mounting of the inductors 54, 62 and 64 is shown in the fragmentary view of a receiver in FIG. 2. This represents a portion of the entire radio received embodying the circuit of FIG. 1. The receiver includes a chassis 100 having an upright shielding partition 102. Inductors 54 and 62 are mounted on a coil form 104 which is supported adjacent the shielding partition 102 by any suitable means. The tuning slug 106 is movable axially within the form 104 and is mechanically coupled to a drive mechanism 108 which may be adjusted to position the slug 106 as well as the tuning slug for the inductor 30 for the purpose of tuning the receiver. As previously indicated, the tuning slug 106 is individually adjusted for alignment purposes by means of the threaded member 110. Leads from the inductor 54 extend through apertures in the shielding partition 102 to connect with the other circuit components in the receiver. The physical construction of the inductor 54 is critical as noted above, and the turns of this coil are preferably wound in grooves of the form 104 to give the inductor greater mechanical stability. However, the inductor 104 is so critical at the frequencies at which the oscillator operates, that even a slight variation in diameter of the coil form 104 or a slight variation in the size of the wire of the inductor 54 or a variation in the permeability of the slug 106 could have a practical influence on the tuning range of the local oscillator.

As shown in FIG. 2, the feedback inductor 62 is wound on the form 104 in inductive relation with the inductor 54. The leads from inductor 62 also extend through the shielding partition 102. Inductor 64 is positioned on the opposite side of the shielding partition 102 from the inductors 54 and 62, and this insures that no inductive coupling exists between inductor 64 and either of the other two inductors. Inductor 64, as illustrated, is self-supporting and is formed of wire having sufficient rigidity to permit proper support thereof. The exact inductance of the inductor 64 may be changed by physically compressing the turns or expanding the turns in the axial direction of the winding.

In a system of pratical construction inductor 64 may be composed of five turns with a coil diameter of the order of ¼ of an inch. Then by physical variation of this coil during alignment of the receiver, an effective variation in the inductance thereof will vary the frefrequency range of the heterodyne oscillator, which together with adjustment of the tuning slug 106 and the trimmer 56 may accurately establish tracking in the receiver and proper oscillator frequency range throughout the tuning conditions of the receiver.

Other components of the circuit in a system of practical construction were as follows:

| | Micromicrofarads |
|---|---|
| Tubes 24, 26 | (1) |
| Capacitors 28, 32 | 33 |
| Capacitors 50, 52 | 10 |
| Capacitor 56 | 3–13 |
| Capacitor 60 | 27 |
| Capacitor 70 | 3.4 |
| Capacitor 72 | 5 |
| Capacitor 74 | 8.2 |
| Capacitor 75 | 3.4 |
| Capacitor 84 | .1 |
| Capacitor 88 | 100 |

[1] 12 DT8.

The invention provides, therefore, an improved heterodyne tuning system for a superheterodyne receiver of the type including a mixer oscillator stage. The tuning system of the invention includes a convenient means for controlling the inductance of the frequency determining network of the oscillator so as to adjust the frequency range of the oscillator, and for achieving this with a minimum of interaction with other elements and by the simple adjustment of a non-critical circuit element.

The invention further provides such an improved tuning system in which the frequency range adjusting means also provides for a uniform oscillator signal amplitude throughout the frequency range of the oscillator, as is desired for optimum operation of the receiver.

What is claimed is:

1. In a superheterodyne receiver, a circuit to produce a signal of intermediate frequency, including in combination (a variable signal tuning circuit tunable to the desired signal, an electron valve having common, input and output electrodes, a variable oscillator tuned circuit connected between said input and common electrodes and including a first inductance coil, said tuned circuits including variable ganged provisions for simultaneous tuning thereof, means for connecting said signal tuning circuit to said electron valve, a feedback circuit connected between said output electrode and said common electrode and including a second inductance coil inductively coupled to said first inductance coil and a further inductance coil connected between said second inductance coil and said common electrode, said further inductance coil being uncoupled from said first and second inductance coils, and said further inductance coil being variable for controlling the tuning range of said oscillator tuned circuit with respect to that of said signal tuning circuit through the inductive coupling of said first and second coils.

2. In a frequency modulation superheterodyne receiver a circuit to produce a signal of intermediate frequency, including in combination, a first variable tuned circuit tunable to the desired signal, a vacuum tube having cathode, grid and anode electrodes, a second variable tuned circuit connected between said grid and cathode electrodes and including a first inductance coil, said second tuned circuit determining the frequency of local oscillations generated in said circuit, said first and second tuned circuits including variable ganged provisions for simultaneous tuning thereof, capacitor means for applying the signal from said first tuned circuit to said grid electrode, a feedback circuit connected between said anode electrode and said cathode electrode and including a second inductance coil inductively coupled to said first inductance coil and a further inductance coil connected between said second inductance coil and said cathode electrode, said further inductance coil being uncoupled from said first and second inductance coils, said further inductance coil being variable for controlling the tuning range of said second tuned circuit with respect to that of said first tuned circuit through the inductive coupling of said first and second coils, and an output circuit connected to said anode electrode to derive a signal of intermediate frequency.

3. In a superheterodyne receiver having oscillator means and mixing means including an electron valve with input, output and common electrodes for converting a desired signal to intermediate frequency, the combination including first variable tuned circuit tunable to the desired signal, a second variable tuned circuit for tuning said oscillator means, said second variable tuned circuit including a first inductance coil, and with said first and second tuned circuits including variable ganged provisions for simultaneous tuning thereof, and a feedback circuit coupled between the output electrode and the common electrode of said electron valve, said feedback circuit including second and third inductance coils connected in series, with said second inductance coil inductively coupled with said first inductance coil and said third inductance coil inductively uncoupled from said first and second inductance coils, and with said third inductance coil being variable for controlling the frequency tuning range of said second tuned circuit with respect to that of said first tuned circuit through the inductive coupling of said first and second coils.

References Cited by the Examiner

UNITED STATES PATENTS

| | | | |
|---|---|---|---|
| 1,278,535 | 9/1918 | Weagant | 250—8 |
| 1,912,616 | 6/1933 | Bailey | 250—20 |
| 2,022,067 | 11/1935 | Wheeler | 250—20 |
| 2,554,230 | 5/1951 | Worcester | 325—453 |
| 2,697,165 | 12/1954 | Blossey | 325—440 |

ROBERT H. ROSE, *Primary Examiner.*

SAMUEL B. PRITCHARD, DAVID G. REDINBAUGH, *Examiners.*

J. R. GAFFEY, R. LINN, *Assistant Examiners.*